United States Patent
Wu et al.

(10) Patent No.: US 12,506,041 B2
(45) Date of Patent: Dec. 23, 2025

(54) HEAT DISSIPATION OPTIMIZATION METHOD OF SILICON-BASED SU-8 THIN FILM PACKAGE

(71) Applicant: SHANGHAI JIAO TONG UNIVERSITY, Shanghai (CN)

(72) Inventors: Linsheng Wu, Shanghai (CN); Xianglin Zhong, Shanghai (CN); Zhonglin Xu, Shanghai (CN); Liangfeng Qiu, Shanghai (CN); Junfa Mao, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 516 days.

(21) Appl. No.: 18/046,927

(22) Filed: Oct. 16, 2022

(65) Prior Publication Data
US 2023/0420327 A1 Dec. 28, 2023

(51) Int. Cl.
*H01L 23/367* (2006.01)
*H01L 21/52* (2006.01)

(52) U.S. Cl.
CPC ............ *H01L 23/367* (2013.01); *H01L 21/52* (2013.01)

(58) Field of Classification Search
CPC .............................. H01L 23/367; H01L 21/52
USPC ........................................................... 257/713
See application file for complete search history.

(56) References Cited

U.S. PATENT DOCUMENTS

| | | | |
|---|---|---|---|
| 2019/0067205 A1* | 2/2019 | Rae .......................... | H01L 24/81 |
| 2022/0157671 A1* | 5/2022 | Marbell ................. | H01L 23/13 |

* cited by examiner

*Primary Examiner* — Quoc D Hoang
(74) *Attorney, Agent, or Firm* — CBM Patent Consulting, LLC

(57) ABSTRACT

A heat dissipation optimization method for silicon-based SU-8 thin film packaging, a molybdenum copper sheet is arranged on the back of the embedded chip, and the chip wiring and interconnection is realized on the front side of the silicon substrate through the metal pattern on the SU-8 photoresist, the silicon wafer thinning process on the back side exposes the molybdenum copper sheet from the surface of the silicon substrate and directly contacts the heat sink to achieve heat dissipation optimization; SU-8 photoresist as the packaging medium, and carries out the MEMS process in combination with the silicon substrate, so as to realize abundant three-dimensional structures and fulfill the requirements of high integration and miniaturization of packaging.

7 Claims, 8 Drawing Sheets

HEAT DISSIPATION OPTIMIZATION METHOD OF SILICON-BASED SU-8 THIN FILM PACKAGE

CROSS REFERENCES

This application claims priority to Chinese Patent Application Ser. No. CN202210752582.3 filed on 28 Jun. 2022.

TECHNICAL FIELD

The invention relates to a technology in the field of three-dimensional integrated wafer-level packaging, in particular to a heat dissipation optimization method for silicon-based SU-8 thin film packaging.

BACKGROUND OF THE INVENTION

The further development of wireless communication technology has put forward new requirements for the high integration and miniaturization of RF front-end components, and system-level packaging has become a new development idea. In the current system-in-package solution, the integration methods for chips include surface mounting, chip stacking and chip embedding. The process of the surface mount chip is relatively simple, but as a two-dimensional package structure, the size of the system package is still large. Chip stacking has a high integration density, but there is no good electromagnetic shielding between chips, and there are problems such as mutual interference between signals. The package design realized by the chip embedding solution embeds the chip inside the silicon substrate, spin-coating photoresist on the surface as the medium, and prepares the interconnection lines between different devices through the semiconductor process, which can not only improve the integration degree, but also can build a well grounded and electromagnetically shielded environment.

SU-8 photoresist is a photoresist material widely used in MEMS process. It is a negative photoresist for near-ultraviolet light. Under the action of ultraviolet light, the double bond in the photoresist molecule is opened, the molecular chains are cross-linked with each other to form a stable and insoluble cross-linked structure. The SU-8 photoresist has good mechanical properties, chemical resistance and thermal stability, and is spin-coated with a wide range of film thicknesses, making it ideal for use as a dielectric material in silicon-based packaging.

With the increasing integration density of RF system packaging, the heat flux density inside the system is also increasing. The local temperature rise problem caused by the active chip as a heat source will pose a great threat to the electrical performance and system reliability of the device inside the package, and may even lead to the failure of the device function. Therefore, in the system package design, heat dissipation design is essential.

SUMMARY OF THE INVENTION

Aiming at the above deficiencies in the prior art, the present invention proposes a heat dissipation optimization method for silicon-based SU-8 thin film packaging, using SU-8 photoresist as the packaging medium, and combining the silicon substrate for MEMS technology to achieve rich three-dimensional structures, complete the high integration and miniaturization requirements of the package, and achieve heat dissipation optimization.

The present invention is achieved through the following technical solutions:

The invention relates to a heat dissipation optimization method for silicon-based SU-8 thin film packaging. The embedded packaging method is adopted, a molybdenum copper sheet is arranged on the back side of the embedded chip, and the wiring is realized on the front side of the silicon substrate through a metal pattern on SU-8 photoresist. The silicon wafer thinning process on the back side exposes the molybdenum copper sheet from the surface of the silicon substrate and directly contacts the heat sink to achieve heat dissipation optimization.

The embedded packaging method refers to: a deep groove corresponding to the embedded chip is opened on the silicon substrate, and the surface of the silicon substrate and the surface of the embedded groove cavity are metallized to build a good grounding and electromagnetic shielding environment. The semiconductor chip is set with a molybdenum copper sheet and then embedded in the deep groove etched on the silicon substrate.

Described packaging method, specifically includes:

Step 1) Spin-coat photoresist on the surface of the smooth silicon wafer, and prepare a grooved pattern mask through a process such as photolithography and development, then perform an etching and slotting process on the silicon wafer, and use acetone to remove the remaining photoresist on the surface.

The etched slot can be etched by wet method or dry method, and the silicon wafer is etched to a certain depth to form the slot, and the depth needs to consider the thickness of both the molybdenum copper sheet and the chip.

Step 2) Apply an appropriate amount of conductive silver glue on the bottom of the slot, first mount the molybdenum copper sheet on the corresponding position, then perform a sputtering process on the surface of the silicon substrate, sputter a layer of metal gold as a seed layer, and then perform an electroplating process After that, the grounding and electromagnetic shielding environment of the embedded chip is constructed, and then the chip is mounted on the metal surface of the molybdenum copper sheet, that is, the embedding of the chip is completed.

Step 3) Spin-coat a layer of SU-8 photoresist on the surface of the silicon substrate after the embedded chip to form a thin film, and obtain a through-hole structure for signal extraction and grounding of the embedded chip through a photolithography development process. A layer of metal seed layer is sputtered on the surface of the film and the inner surface of the through hole structure, that is, the photoresist SU-8 is used as a dielectric layer to form a through hole structure.

The spin coating, preferably in a vacuum environment, improves the surface flatness.

Step 4) Spin-coating photoresist again on the metal seed layer, fabricating a wiring pattern mask through a photolithography development process, the exposed area is the SU-8 thin film through-hole structure and wiring area, and the entire substrate is etched. etch process to remove excess metal seed layer.

The SU-8 thin film through-hole structure and the wiring area have an increased metal thickness after the electroplating process, and acetone is used to clean and remove the remaining photoresist on the surface of the silicon substrate.

Step 5) after the silicon substrate and the temporary carrier are temporarily bonded by the bonding film, the entire substrate is inverted and the silicon substrate backside is carried out the silicon wafer thinning process, until the molybdenum-copper sheet is exposed on the surface of the substrate, the substrate is debonded from temporary slide and place on heat sink.

Technical Effect

The present invention is embedded in the deep groove etched on the silicon substrate after the semiconductor chip is arranged on the molybdenum-copper sheet, so that the heat generated by the chip is exported through the molybdenum-copper sheet faster; After temporary bonding through the bonding film, the silicon wafer thinning process is performed on the back of the substrate to expose the molybdenum-copper sheet, so that the heat generated by the chip can be quickly transferred to the heat sink directly through the molybdenum-copper sheet, so as to improve the heat dissipation efficiency and reduce the overall temperature at which the substrate operates.

Figure 1:
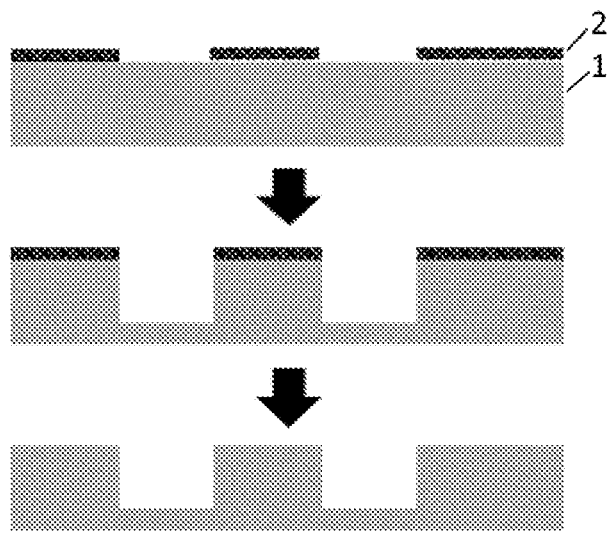
FIG. 1 is silicon substrate dry etching groove schematic diagram.

In the figure: silicon substrate 1, photoresist 2, molybdenum-copper sheet 3, gold 4, embedded chip 5, SU-8 photoresist 6, temporary slide 7, heat sink 8, driver amplifier chip 9, A power amplifier chip 10, a phase shifter chip 11, a low noise amplifier chip 12, a reflective SPDT switch chip 13, a plate capacitor 14, and a power divider 15.

DETAILED DESCRIPTION OF THE INVENTION

Figure 6:
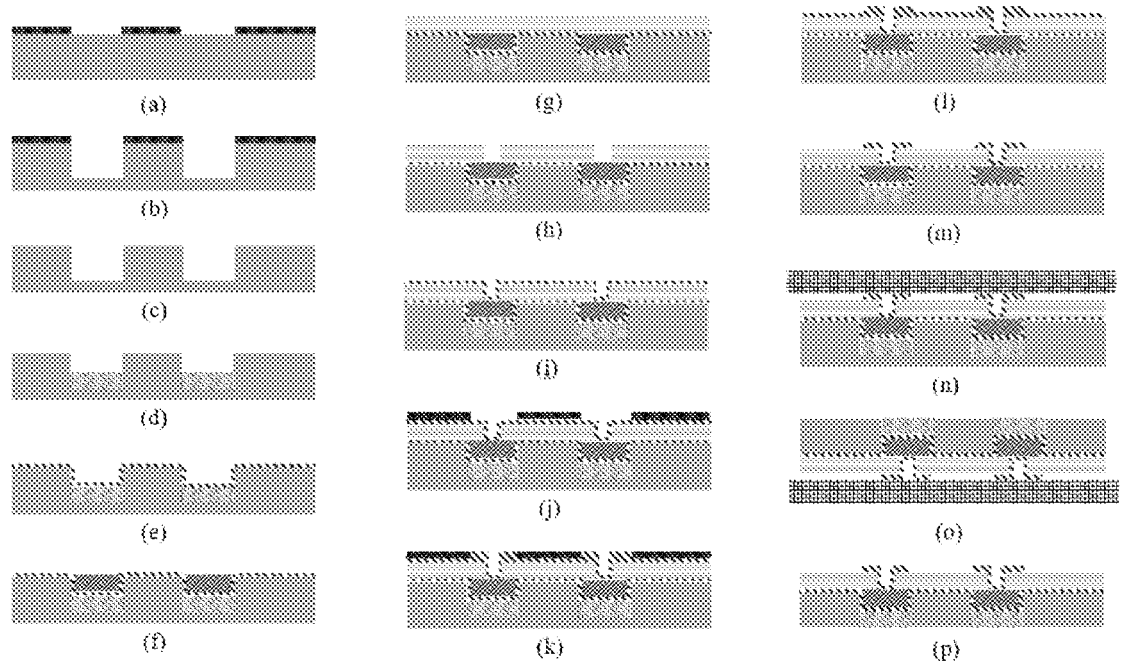
FIG. 6 is the method flow schematic diagram of the present invention.

As shown in FIG. 6, the present embodiment relates to a heat dissipation optimization method of a silicon-based SU-8 thin film package, comprising the following steps:

Step 1) as shown in FIG. 1, firstly, spin-coating photoresist 2 on the surface of smooth and clean silicon substrate 1, this photoresist is used to prepare the mask of the slotted pattern, and processes such as photolithography development can make the exposed part of the silicon wafer can be etched and grooved without photoresist protection. The depth of the etching is the sum of the thicknesses of the molybdenum copper sheet and the chip. After the etching process is completed, the silicon substrate is placed in the acetone solution, preferably ultrasonic cleaning is performed to remove the remaining photoresist 2, that is, the etching and grooving of the silicon substrate is completed.

Figure 2:
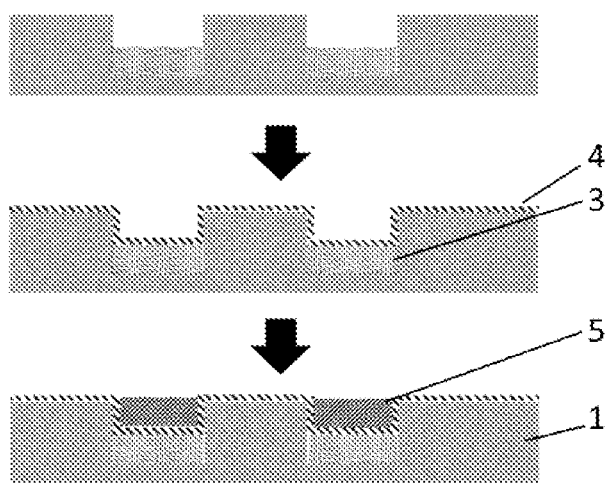
FIG. 2 is a schematic diagram of the embedded molybdenum-copper sheet and chip.

Step 2) as shown in FIG. 2, apply appropriate amount of conductive silver glue at the bottom of the silicon substrate slot, and mount the molybdenum-copper sheet 3 of the corresponding size on the corresponding position, and then carry out the sputtering process to the surface of the silicon substrate. A layer of metal gold 4 is sputtered as a seed layer, and then an electroplating process is performed to construct a grounding and electromagnetic shielding environment for the embedded chip, and the embedded chip 5 is mounted on the electroplated metal surface on the molybdenum-copper sheet through conductive silver glue. Embedding of molybdenum-copper sheets and chips is completed.

Figure 3:
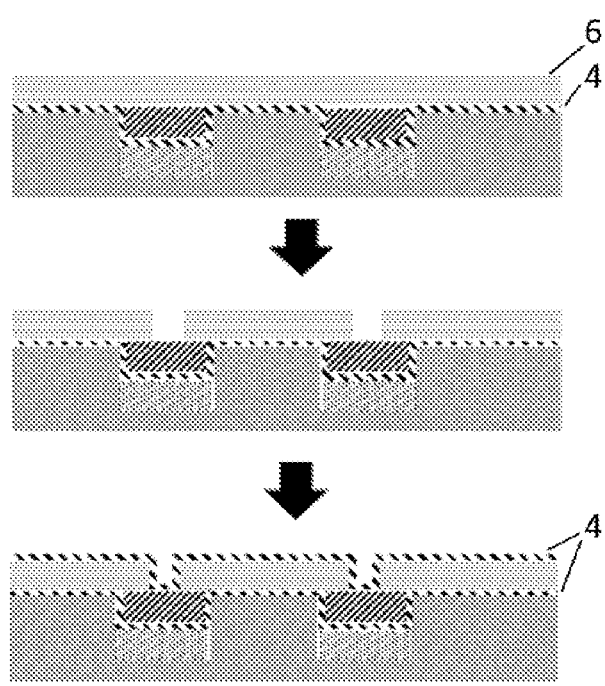
FIG. 3 is the schematic diagram of SU-8 spin coating lithography out through hole.

Step 3) As shown in FIG. 3, a layer of SU-8 photoresist 6 is spin-coated on the surface of the silicon substrate 1 after the embedded chip, preferably the method of spin-coating in a vacuum environment improves the surface flatness. The SU-8 photoresist 6 film is pre-baked and then the photolithography process is performed. The photolithography uses the corresponding mask, and after a period of post-baking, the development is carried out, and the through-hole structure corresponding to the mask can be obtained. This structure is used for the chip signal extraction and grounding. Drying the silicon substrate after development, sputtering a layer of metal gold 4 seed layers on the surface of the SU-8 photoresist 6 film. That is to say, the SU-8 photoresist is used as the dielectric layer to spin-coat and lithography the through-hole interconnection structure.

Figure 4:
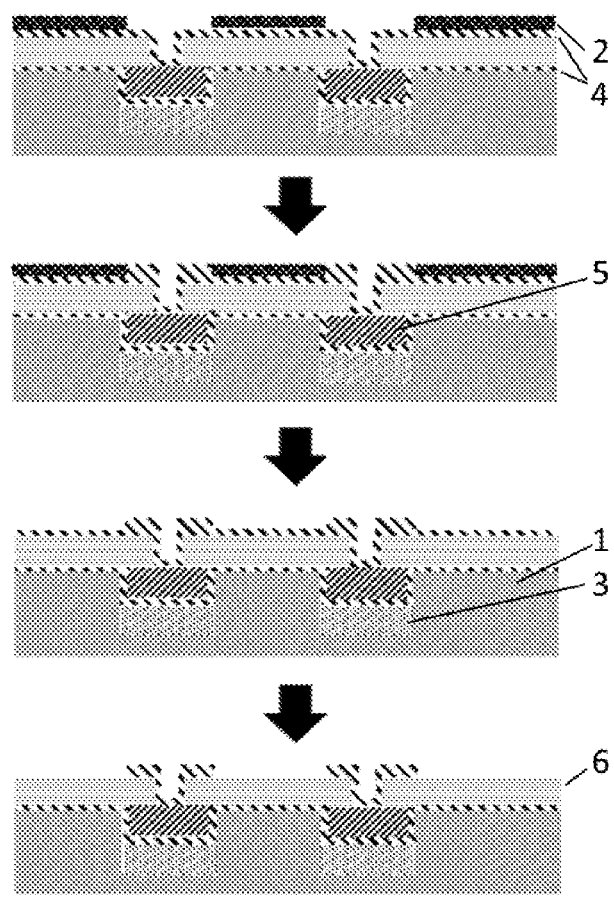
FIG. 4 is the schematic diagram of metallized wiring interconnection processing.

Step 4) as shown in FIG. 4, spin coating photoresist 2 on the metal seed layer, this photoresist is used to prepare the mask of wiring pattern, and the area exposed after its photolithography development is the through-hole structure and metal wiring of the SU-8 film, because there is no photoresist protection in this area, the metal thickness is increased by electroplating, and then placed in an acetone solution to remove the remaining photoresist, and then the silicon substrate is subjected to a metal etching process after drying. At this time, the metal seed layer is etched cleanly, and the rest is the metal wiring and through-hole interconnection structure, that is, the processing of the metallized wiring and interconnection is completed.

Figure 5:
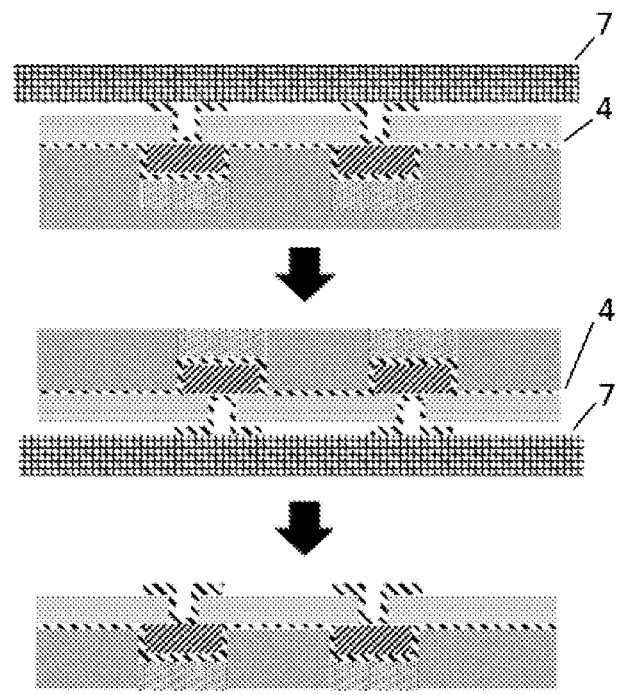
FIG. 5 is the schematic diagram of silicon wafer thinning.

Step 5) As shown in FIG. 5, temporarily bonding the substrate after wiring processing and the temporary carrier 7 through the bonding film, and inverting the entire silicon substrate 1, and thinning the silicon wafer on the back of the silicon substrate 1 process until the molybdenum-copper sheet 3 is exposed on the back surface of the substrate, and finally the silicon substrate 1 and the temporary carrier 7 are debonded. At this point, the entire process flow is completed, and the heat dissipation optimization design of silicon-based SU-8 thin film packaging and thinning of the silicon substrate and embedded molybdenum-copper sheet is realized.

Figure 7A:
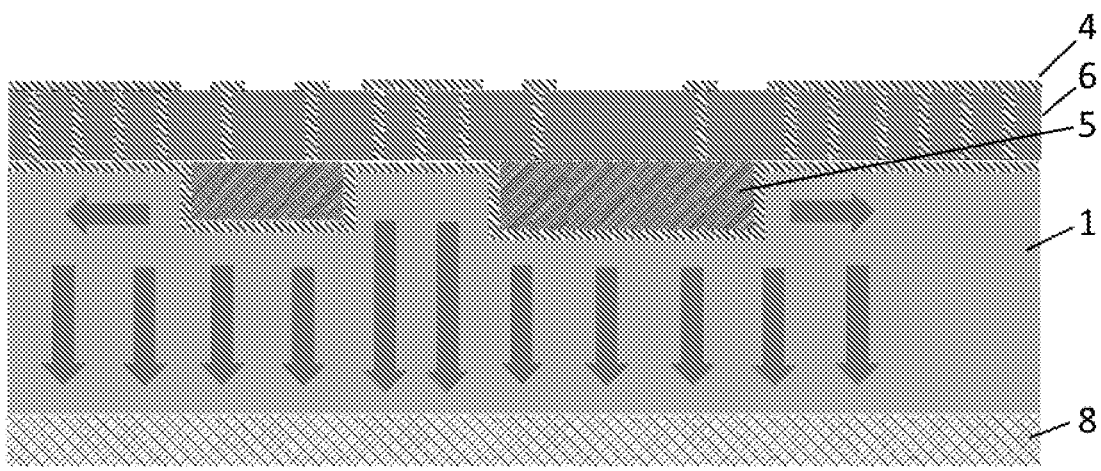
FIG. 7a is the schematic diagram of heat dissipation path of silicon-based SU-8 thin film package before adding molybdenum-copper sheet and thinning silicon substrate.
Figure 7B:
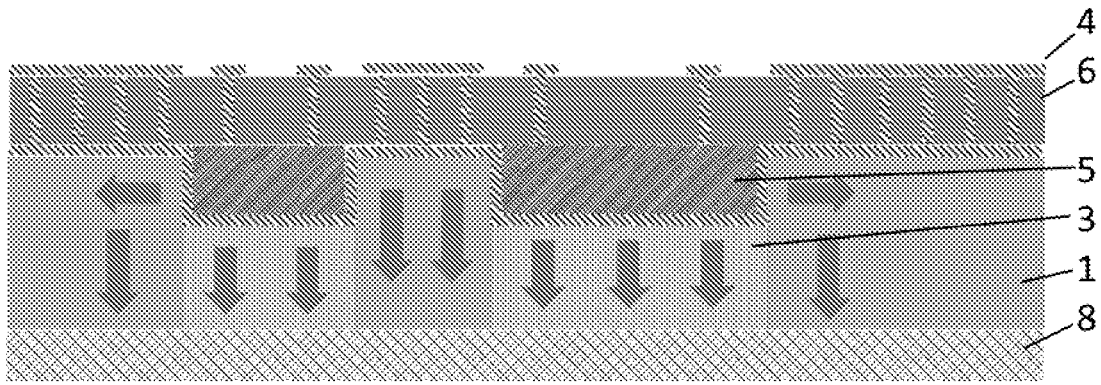
FIG. 7b is the schematic diagram of heat dissipation path of silicon-based SU-8 thin film package after adding molybdenum-copper sheet and thinning silicon substrate.

FIG. 7a is a schematic diagram of the heat dissipation path of the chip directly embedded in the silicon substrate; FIG. 7b is a diagram of the heat dissipation path after adding a molybdenum copper sheet and thinning the silicon substrate; adding a molybdenum-copper sheet 3 at the bottom of the chip, the high thermal transmission efficiency of the molybdenum-copper sheet can conduct the heat of the chip to the heat sink 8 more quickly, and the thinning of the silicon substrate can shorten the heat transfer path, and the heat dissipation efficiency is also improved.

Figure 8A:
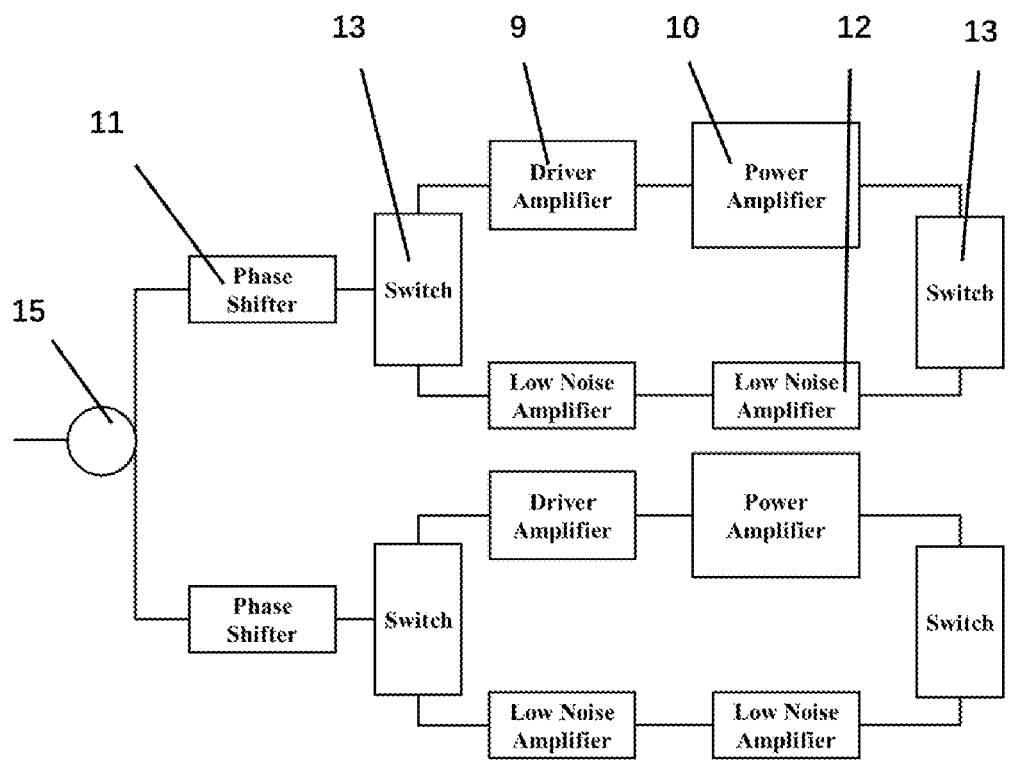
FIG. 8a is the package system block diagram of the present invention.
Figure 8B:
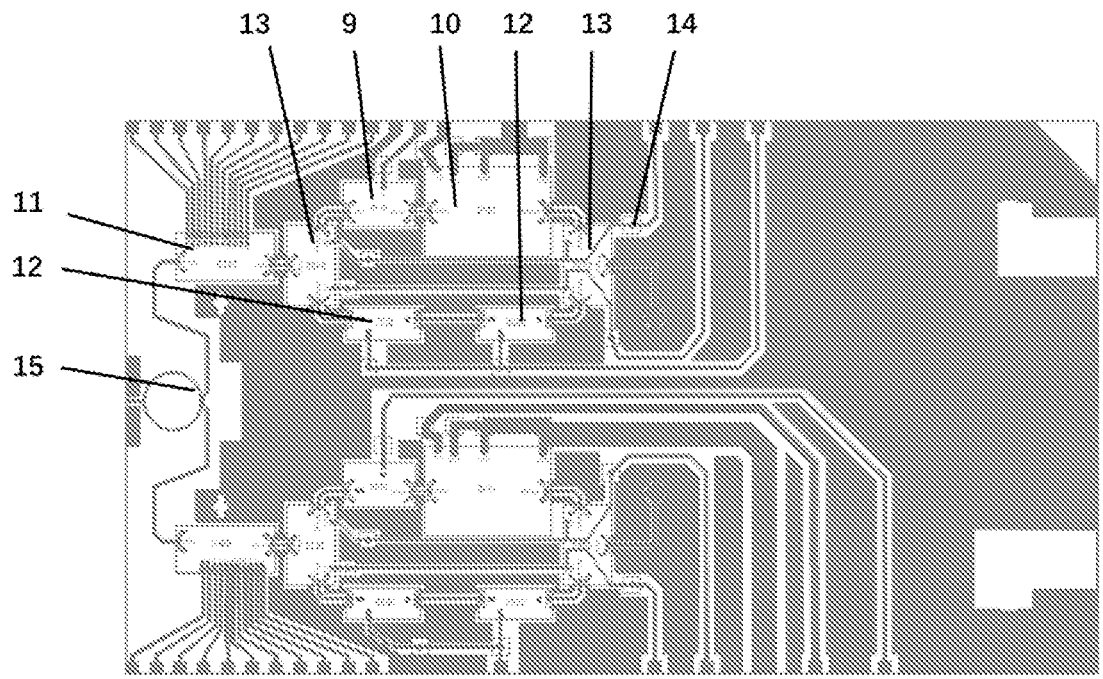
FIG. 8b is the embedded chip distribution schematic diagram.

As shown in FIG. 8a-b, it is a schematic diagram of the package system block diagram and embedded chip distribution of the present invention; as shown in FIG. 8a, when the reflective SPDT switch chip 13 is switched to the transmission channel, the signal is divided by the power divider 15. The path passes through the phase shifter chip 10 and then enters the driver amplifier chip 9 and the power amplifier chip 10 to amplify the signal output; when the reflective SPDT switch 13 is switched to the receiving channel, the signal is amplified by the two-stage low-noise amplifier 12, after the phase-shifted chip 10 is combined and output by the power divider 15.

As shown in FIG. 8b, the size of the described driver amplifier chip 9 is 1.8×1.1×0.07 mm$^3$; the size of the described power amplifier chip 10 is 3.18×2.25×0.08 mm$^3$; the described phase shifter The size of the chip 11 is 2.5×1.2×0.07 mm$^3$; the size of the low-noise amplifier chip 12 is 1.85×0.8×0.07 mm$^3$; the size of the reflective SPDT switch chip 13 is 2×1.2×0.1 mm$^3$. The size of the plate capacitor 14 is 0.38×0.38×0.178 mm$^3$; the size of the power divider 15 is 2×2.4×0.04 mm$^3$.

The driver amplifier chip 9, the power amplifier chip 10, the phase shifter chip 11, the low noise amplifier chip 12 and the reflective SPDT switch chip 13 are all GaAs chips, and the flat capacitor 14 is a high dielectric ceramic chip, the power divider 15 is a passive device embedded in SU-8.

Figure 9A:
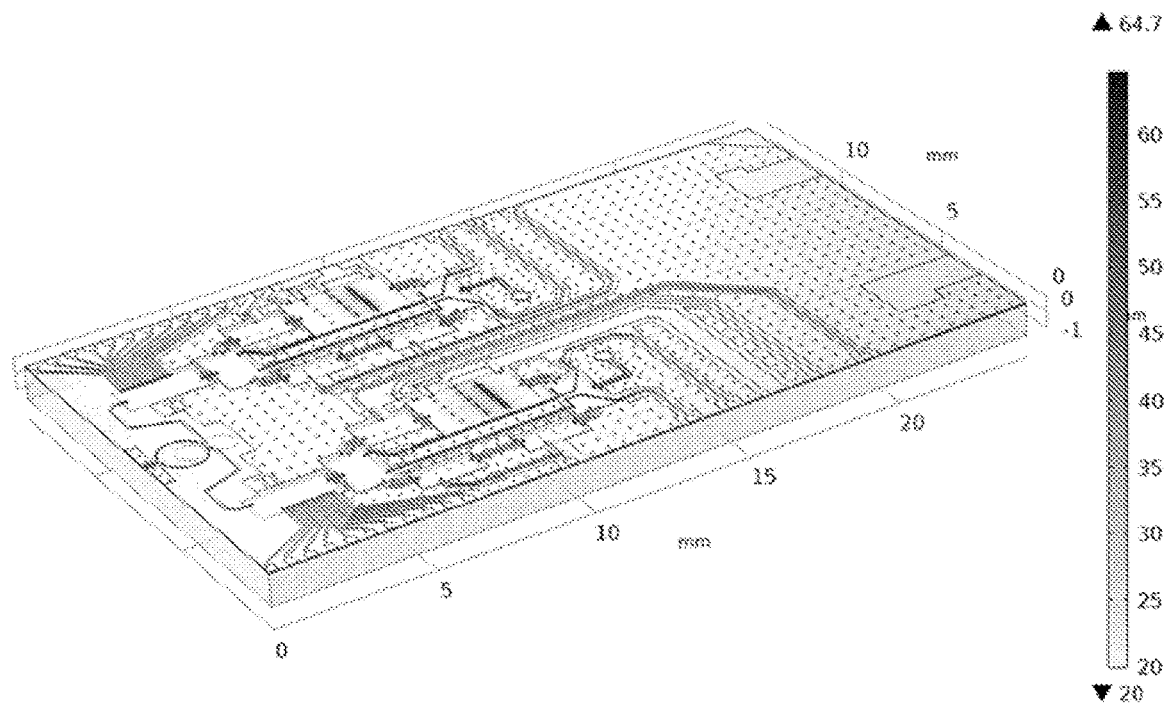
FIG. 9a is the thermal simulation contrast diagram of silicon-based SU-8 thin-film package before and after adding molybdenum-copper sheet and thinning silicon substrate.
Figure 9B:
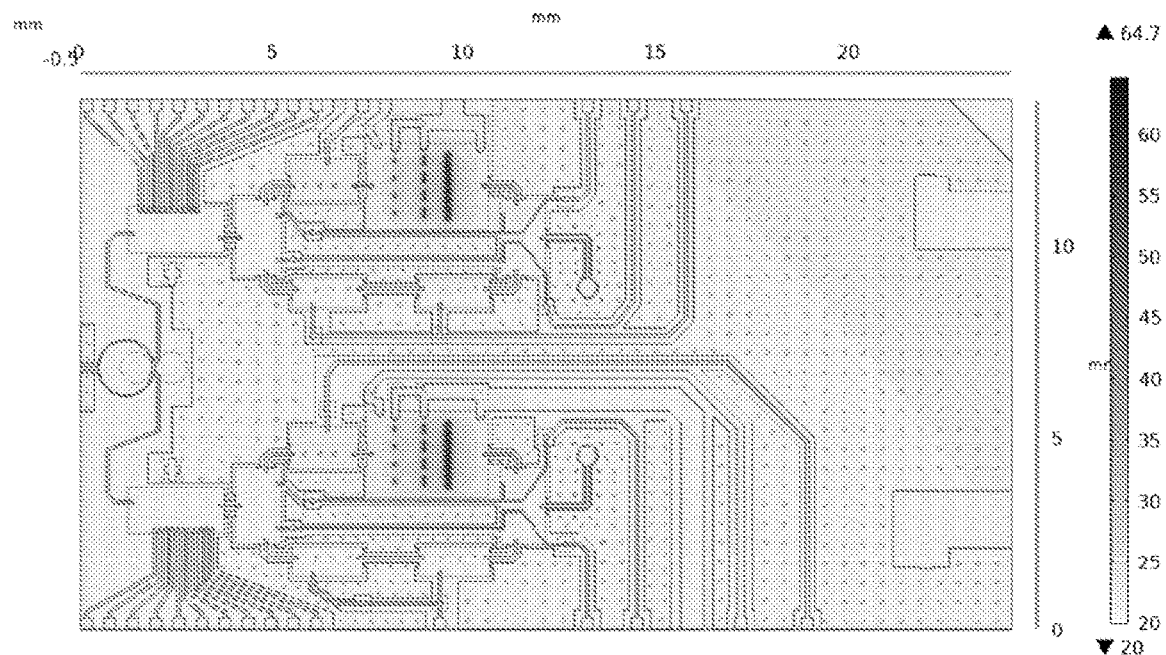
FIG. 9b is the thermal simulation contrast diagram of silicon-based SU-8 thin-film package before and after adding molybdenum-copper sheet and thinning silicon substrate.
Figure 9C:
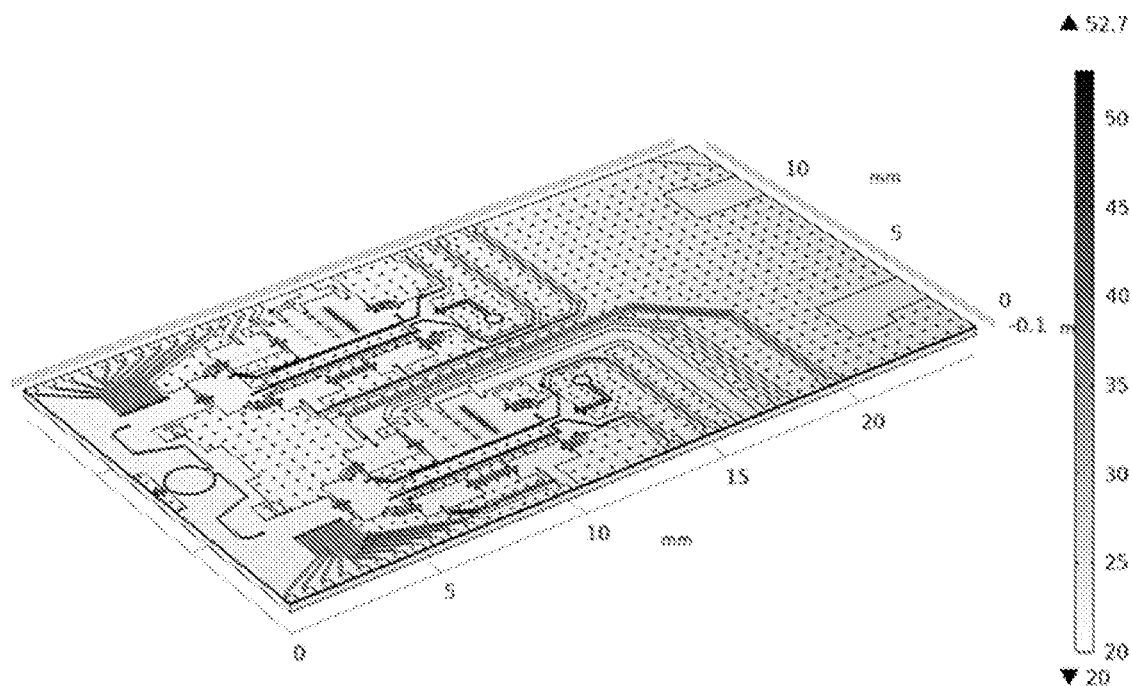
FIG. 9c is the thermal simulation contrast diagram of silicon-based SU-8 thin-film package before and after adding molybdenum-copper sheet and thinning silicon substrate.
Figure 9D:
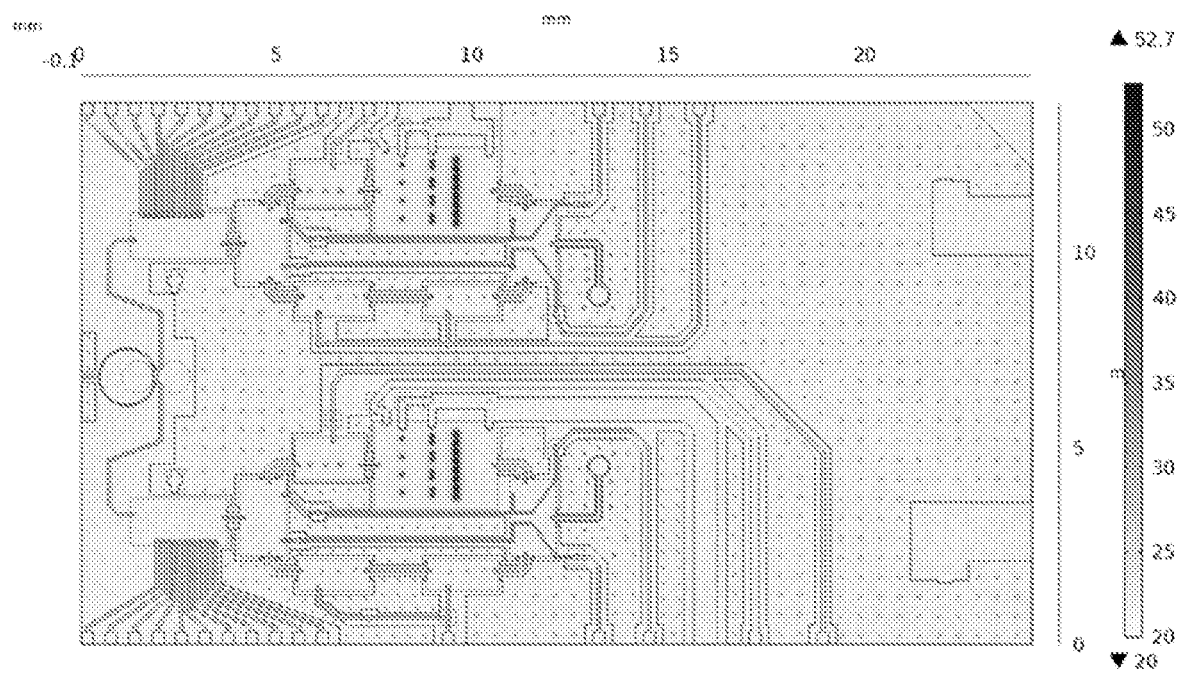
FIG. 9d is the thermal simulation contrast diagram of silicon-based SU-8 thin-film package before and after adding molybdenum-copper sheet and thinning silicon substrate.

The thermal simulation comparison diagram of silicon-based SU-8 thin film package before and after adding molybdenum copper sheet and thinning silicon substrate as shown in FIG. 9a-d; wherein FIG. 9a and FIG. 9b, the thickness of the silicon substrate is 1 mm, the ambient temperature is 20° C., the maximum temperature at the power amplifier chip is 64.7° C., and the maximum temperature rise is 44.7° C.; FIGS. 9c and 9d show the thinning of the silicon substrate after embedding the molybdenum copper sheet. At this time, the silicon substrate is thinned to 0.25 mm and a molybdenum-copper sheet is embedded in the bottom area of the power amplifier chip. The maximum temperature is 52.7° C., and the maximum temperature rise is 32.7° C. The heat generated by the chip can be dissipated well, and the heat dissipation performance has improved by 27%, achieving significant results.

Described power amplifier chip 10 single heat dissipation power is 8.86 W, and heat source area is mainly located in transistor channel, and the heat dissipation of last stage is the most serious in power amplifier three-stage amplification, totally six transistors, single transistor area It is 0.17×0.15 mm$^2$, and the heat density per unit area is 58 W/mm$^2$.

Compared with the prior art, the method can dissipate the heat generated by the chip in time, the temperature rise range is reduced, and the chip can work more stably.

Above-mentioned specific implementation can be carried out partial adjustment to it in different ways by those skilled in the art under the premise that does not deviate from principle of the present invention and purpose, protection scope of the present invention is based on claims and is not limited by above-mentioned specific implementation, each implementation scheme within its scope is bound by the present invention.

What is claimed is:

1. A method for optimizing heat dissipation of silicon-based SU-8 thin film packaging, in which, an embedded packaging method is adopted, a molybdenum copper sheet is arranged on a back of the embedded chip, and a wiring interconnection via metal pattern on a SU-8 photoresist on a front side of a silicon substrate, and a silicon wafer thinning process on a back side exposes the molybdenum copper sheet from a surface of the silicon substrate and directly contacts a heat sink to achieve heat dissipation optimization; the embedded package method consists: etching a deep groove corresponding to the embedded chip on the silicon substrate, metalling the surface of the silicon substrate and an embedded groove cavity surface to build a good grounding and electromagnetic shielding environment; and set a semiconductor chip with the molybdenum copper sheet and then embedded in the deep groove etched on the silicon substrate;

wherein the method comprises the following steps of:
  i) preparing a grooved pattern mask through a process such as photolithography and development, then performing an etching and slotting process on the silicon wafer, and using acetone to remove the remaining photoresist on the surface;
  ii) applying a conductive silver glue on a bottom of a slot, mounting the molybdenum copper sheet on a corresponding position, then performing a sputtering process on the surface of the silicon substrate, sputtering a layer of metal gold as a seed layer, and then performing an electroplating process; constructing a grounding and electromagnetic shielding environment of the embedded chip, and mounting the embedded chip on a metal surface of the molybdenum copper sheet;
  iii) spin-coating a layer of the SU-8 photoresist on the surface of the silicon substrate form a thin film, and obtain a through-hole structure for signal extraction and grounding of the embedded chip through a photolithography development process; sputtering a layer of metal seed layer on a surface of the thin film and on an inner surface of the through-hole structure; wherein the photoresist SU-8 is used as a dielectric layer to make the through-hole structure;
  iv) spin-coating the SU-8 photoresist on the metal seed layer, fabricating a wiring pattern mask through the photolithography development process, an exposed area is between a SU-8 thin film through-hole structure and a wiring area; and the silicon substrate is etched to remove excess metal seed layer;
  v) binding the silicon substrate and a temporary carrier by a bonding film, inventing the silicon substrate, and performing the silicon wafer thinning process on the back of the silicon substrate until the molybdenum copper sheet is exposed on the surface of the silicon substrate; then, de-binding the silicon substrate by placing in a heat sink.

2. The method for optimizing heat dissipation of silicon-based SU-8 thin film packaging according to claim 1, wherein the spin coating method in a vacuum environment improves the surface flatness.

3. The method for optimizing heat dissipation of silicon-based SU-8 thin film packaging according to claim 1, wherein the through hole and the wiring area to be patterned are cleaned with acetone to remove the remaining photoresist after the electroplating process; the exposed metal is a surface metal.

4. An embedded chip package produced by method according to claim 1, comprising: a driver amplifier chip, a power amplifier chip, a phase shifter chip, a low noise amplifier chip, a reflective type chip SPDT switch chip, a flat capacitor and a power divider; when the reflective type chip SPDT switch chip is switched to a transmitting channel, a signal is branched from the power splitter through the phase shifter chip and then enters the driver amplifier chip and the power amplifier chip to amplify a signal output; when the reflective type chip SPDT switch is switched to a receiving channel, the signal is amplified by a two-stage low-noise amplifier, and is combined and output by the power divider after passing through the phase shifter chip.

5. The embedded chip package according to claim 4, wherein the driver amplifier chip, the power amplifier chip, the phase shifter chip, the low noise amplifier chip and the reflective type chip SPDT switch chip are all GaAs chips, the plate capacitor is a high dielectric ceramic chip, and the power divider is a passive device embedded in SU-8.

6. The embedded chip package according to claim 5, wherein the size of the driver amplifier chip is 1.8×1.1×0.07 mm$^3$; the size of the power amplifier chip is 2.18×2.25×0.08 mm$^3$; the size of the phase shifter chip is 2.5×1.2×0.07 mm$^3$; the size of the low noise amplifier chip is 1.85×0.8×0.07 mm$^3$; the size of the reflective SPDT switch chip It is 2×1.2×0.1 mm$^3$, the size of the plate capacitor is 0.38×0.38×0.178 mm$^3$; the size of the power divider is 2×2.4×0.04 mm$^3$.

7. The embedded chip package according to claim 4, wherein the size of the driver amplifier chip is 1.8×1.1×0.07 mm$^3$; the size of the power amplifier chip is 3.18×2.25×0.08 mm$^3$; the size of the phase shifter chip is 2.5×1.2×0.07 mm$^3$; the size of the low noise amplifier chip is 1.85×0.8×0.07 mm$^3$; the size of the reflective SPDT switch chip It is 2×1.2×0.1 mm$^3$, the size of the plate capacitor is 0.38×0.38×0.178 mm$^3$; the size of the power divider is 2×2.4×0.04 mm$^3$.

* * * * *